United States Patent
Choi et al.

(10) Patent No.: US 8,600,076 B2
(45) Date of Patent: Dec. 3, 2013

(54) MULTIBAND DRC SYSTEM AND METHOD FOR CONTROLLING THE SAME

(75) Inventors: Yeongha Choi, Anyang-si (KR); Min Soo Kim, Gwangmyeong-si (KR)

(73) Assignee: Neofidelity, Inc., Seoul (KR)

( * ) Notice: Subject to any disclaimer, the term of this patent is extended or adjusted under 35 U.S.C. 154(b) by 381 days.

(21) Appl. No.: 12/938,586

(22) Filed: Nov. 3, 2010

(65) Prior Publication Data

US 2011/0110533 A1    May 12, 2011

(30) Foreign Application Priority Data

Nov. 9, 2009  (KR) .................. 10-2009-0107604
Nov. 9, 2009  (KR) .................. 10-2009-0107605

(51) Int. Cl.
  *H03G 3/00* (2006.01)
  *H04R 25/00* (2006.01)

(52) U.S. Cl.
  USPC ........................... 381/106; 381/320; 381/104

(58) Field of Classification Search
  USPC ......... 381/320, 321, 94.2, 94.3, 102, 106, 98, 381/99, 101, 103, 107
  See application file for complete search history.

(56) References Cited

U.S. PATENT DOCUMENTS

| | | | | |
|---|---|---|---|---|
| 4,852,175 | A * | 7/1989 | Kates ............................. | 381/317 |
| 6,731,767 | B1 * | 5/2004 | Blamey et al. ................. | 381/312 |
| 6,873,709 | B2 * | 3/2005 | Hou ............................... | 381/106 |
| 7,305,100 | B2 * | 12/2007 | Pedersen ........................ | 381/320 |
| 8,144,882 | B2 * | 3/2012 | Christoph et al. .............. | 381/57 |
| 2011/0069846 | A1 * | 3/2011 | Cheng et al. ................... | 381/92 |

* cited by examiner

*Primary Examiner* — Vivian Chin
*Assistant Examiner* — William A Jerez Lora
(74) *Attorney, Agent, or Firm* — Stein IP, LLC

(57) ABSTRACT

A multiband DRC system and a method for controlling the same are disclosed. In accordance with the present invention, the system and the method are capable of increasing an overall loudness of an output signal by controlling thresholds and gains of plurality of DRCs included in the multiband DRC system according to frequency bands.

9 Claims, 12 Drawing Sheets

<Prior Art>

MULTIBAND DRC SYSTEM AND METHOD FOR CONTROLLING THE SAME

This application claims the benefit of Korean Patent Applications No. 10-2009-0107604 and 10-2009-0107605 filed on Nov. 9, 2009, which is hereby incorporated for reference.

BACKGROUND OF THE INVENTION

1. Field of the Invention

The present invention relates to a multiband DRC system and a method for controlling the same, and more particularly to a multiband DRC system and a method for controlling the same capable of increasing an overall loudness of an output signal by controlling thresholds and gains of a plurality of DRCs included in the multiband DRC system.

2. Description of the Related Art

A DRC (Dynamic range compressor) dynamically limits and controls an amplitude of an output signal according to that of an input signal.

FIG. 1 is block diagram exemplifying a conventional DRC.

Referring to FIG. 1, the conventional DRC 10 includes a delay line 20, a gain controller 30 and a multiplier 40.

The conventional DRC 10 obtains an amplitude of an input signal in real-time and computes a proper gain, and then adjusts the amplitude of the output signal according to the computed gain.

That is, when the amplitude of the input signal exceeds a predetermined threshold, the gain controller 30 obtains a rate of increase with respect to the threshold, and the multiplier 40 multiplies a reciprocal of the rate to the input signal passed through the delay line 20 to limit the amplitude of the output signal to be below the threshold.

FIG. 2 is a graph exemplifying a relationship between an input level and an output level of the conventional DRC.

As shown on FIG. 2, when the input level exceeds the threshold, the output signal is compressed. That is, when the input level exceeds the threshold, a gain, which is a ratio of the output signal to the input signal, is decreased.

The conventional DRC has following disadvantages.

When the input signal having an amplitude larger than the threshold is concentrated in one frequency band, the amplitude of the output signal is limited according to the amplitude of the input signal. Therefore, it is disadvantageous that the input signal in one frequency band is reproduced with a relatively small loudness. For instance, when an audio signal having an amplitude larger than the threshold is concentrated in a high frequency band, the amplitude of the output signal is limited according to the amplitude the input signal of the high frequency band. Therefore, an audio signal of the low frequency band which has small amplitude than the audio of the high frequency band is reproduced with the relatively small loudness.

Moreover, a speaker with a small diameter has a poor low frequency reproduction capability compared to a speaker with a large diameter. The conventional DRC limits the amplitude of the output signal regardless of the frequency band. Therefore, when the threshold is selected on the basis of the audio signal of the low frequency, the audio signal of the high frequency band can not be sufficiently reproduced.

SUMMARY OF THE INVENTION

It is an object of the present invention to provide a multiband DRC system and a method for controlling the same capable of increasing an overall loudness of an output signal by controlling thresholds and gains of a plurality of DRCs included in the multiband DRC system.

In order to achieve above-described object of the present invention, there is provided a multiband DRC system, including: a filtering unit for dividing a digital audio signal into a first band audio signal through an $N^{th}$ band audio signal according to (N−1) crossover frequencies; a first DRC through an $N^{th}$ DRC having a first threshold through an $N^{th}$ threshold, respectively, the first DRC through the $N^{th}$ DRC dynamically compressing the first band audio signal through the $N^{th}$ band audio signal, respectively; and an adder for adding output signals of the first DRC through the $N^{th}$ DRC, wherein the first threshold through the $N^{th}$ threshold are selected according to a target THD and the (N−1) crossover frequencies.

The system in accordance with the present invention may further include a post DRC for dynamically compressing an output signal of the adder.

Preferably, the filtering unit includes a first filter through an $N^{th}$ filter for dividing the digital audio signal into the first band audio signal through the $N^{th}$ band audio signal, respectively, according to the (N−1) crossover frequencies.

The system in accordance with the present invention may further include a gain controller for controlling gains of the first DRC through the $N^{th}$ DRC according to an upper limit of differences between the gains.

Preferably, the gain controller limits one of gains of an $L^{th}$ DRC and an $M^{th}$ DRC such that a difference between the gains of the $L^{th}$ DRC and the $M^{th}$ DRC is no more than the upper limit when the difference between the gains of the $L^{th}$ DRC and the $M^{th}$ DRC exceeds the upper limit (where each of L and M is a natural number satisfying $1 \leq L, M \leq N$).

There is also provided a method for controlling the multiband DRC system, including: (a) dividing a digital audio signal into a first band audio signal through an $N^{th}$ band audio signal according to (N−1) crossover frequencies; (b) selecting a first threshold through an $N^{th}$ threshold of a first DRC, respectively, according to a target THD and the (N−1) crossover frequencies; (c) dynamically compressing the first band audio signal through the $N^{th}$ band audio signal inputted to the first DRC through the $N^{th}$ DRC according to the first threshold through the $N^{th}$ threshold, respectively; and (d) adding the first band audio signal through the $N^{th}$ band audio signal dynamically compressed in (c).

The method in accordance with the present invention may further include (e) dynamically compressing the first band audio signal through the $N^{th}$ band audio signal added in (d).

Preferably, step (c) includes: (c-1) inputting the first band audio signal through the $N^{th}$ band audio signal to the first DRC through the $N^{th}$ DRC, respectively; (c-2) selecting gains of the first DRC through the $N^{th}$ DRC according to an upper limit of differences between the gains; and (c-3) dynamically compressing the first band audio signal through the $N^{th}$ band audio signal according to the gains selected in (c-2).

Preferably, step (c-2) includes limiting one of gains of an $L^{th}$ DRC and an $M^{th}$ DRC such that a difference between the gains of the $L^{th}$ DRC and the $M^{th}$ DRC is no more than the upper limit when the difference between the gains of the $L^{th}$ DRC and the $M^{th}$ DRC exceeds the upper limit (where each of L and M is a natural number satisfying $1 \leq L, M \leq N$).

DETAILED DESCRIPTION OF THE INVENTION

A multiband DRC system and a method for controlling the same in accordance with the present invention will be described in detail with reference to accompanied drawings.

Figure 1:
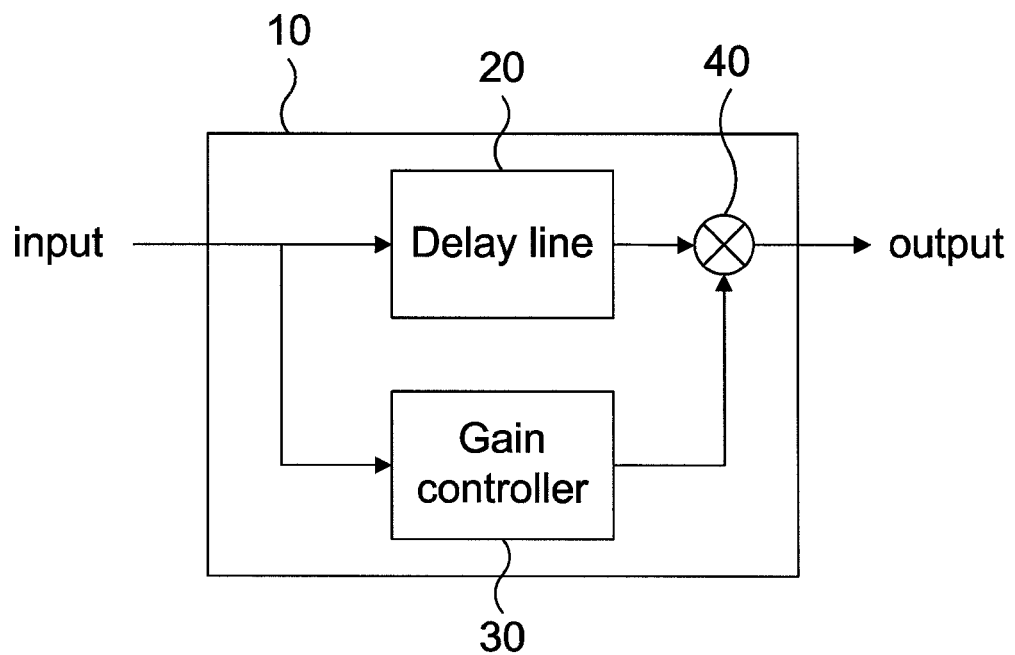
FIG. 1 is block diagram exemplifying a conventional DRC.
Figure 2:
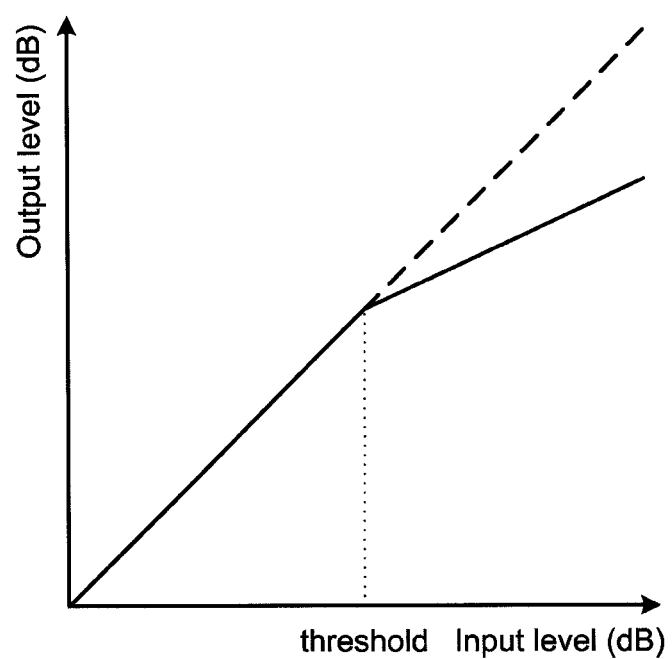
FIG. 2 is a graph exemplifying a relationship between an input level and an output level of the conventional DRC.
Figure 3:
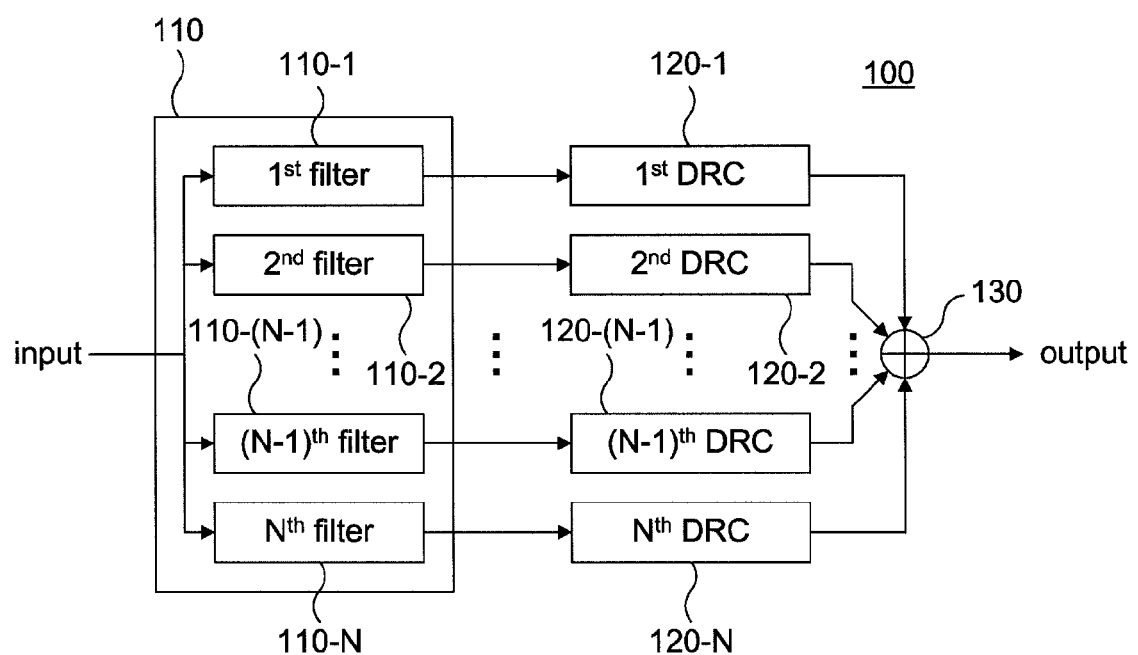
FIG. 3 is a block diagram exemplifying a multiband DRC system in accordance with a first embodiment of the present invention.

FIG. 3 is a block diagram exemplifying a multiband DRC system in accordance with a first embodiment of the present invention.

Referring to FIG. 3, the multiband DRC system 100 in accordance with the first embodiment of the present invention includes a filtering unit 110, a first DRC 120-1 though an $N^{th}$ DRC 120-N and an adder 130.

In addition, the filtering unit 110 includes a first filter 110-1 through an $N^{th}$ filter 110-N.

The filtering unit 110 divides a digital audio signal into a first band audio signal through an $N^{th}$ band audio signal according to (N−1) crossover frequencies.

The filtering unit 110 includes the first filter 110-1 though the $N^{th}$ filter 110-N for dividing the digital audio signal into the first band audio signal through the $N^{th}$ band audio signal according to the (N−1) crossover frequencies which are selected according to a target THD (Total Harmonic Distortion). The target THD and the crossover frequency will be described later with reference to FIG. 4.

The first DRC 120-1 through the $N^{th}$ DRC 120-N dynamically compress output signals of the filtering unit 110, i.e., the first band audio signal through the $N^{th}$ band audio signal, respectively.

The adder 130 adds the output signals of the first DRC 120-1 through the $N^{th}$ DRC 120-N.

A configuration of the multiband DRC system 100 in accordance with the first embodiment of the present invention are described hereinafter in greater detail.

Figure 4:
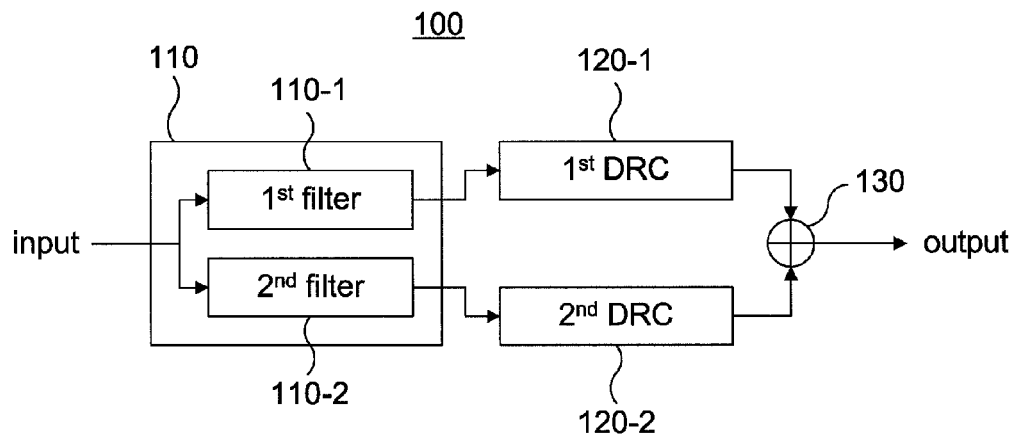
FIG. 4 is a block diagram exemplifying a multiband DRC system including two DRCs in accordance with a first embodiment of the present invention.

FIG. 4 is a block diagram exemplifying the multiband DRC system 100 in accordance with the first embodiment of the present invention, wherein the system includes the two DRCs, i.e., n is 2.

Referring to FIG. 4, the multiband DRC system 100 in accordance with the first embodiment of the present invention includes the filtering unit 110, the first DRC 120-1, the second DRC 120-2 and the adder 130.

The filtering unit 110 includes the first filter 110-1 and the second filter 110-2 dividing the digital audio signal into the first band audio signal and the second band audio signal, respectively, according to the crossover frequency.

Figure 5:
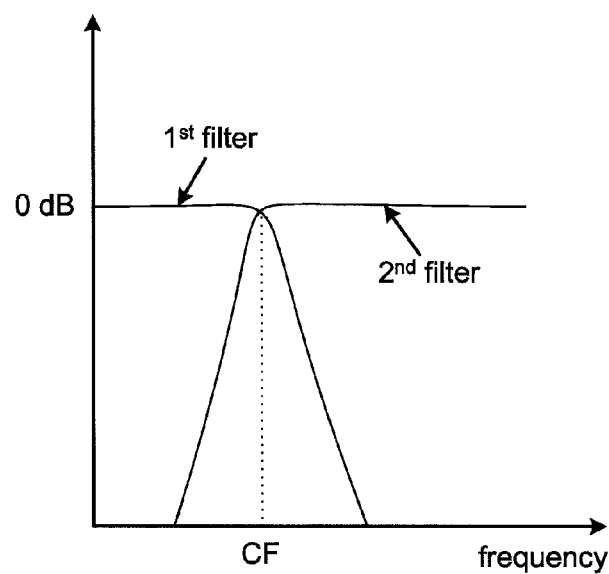
FIG. 5 is a graph exemplifying frequency responses of a first filter and a second filter included in a filtering unit shown in FIG. 4.

FIG. 5 is a graph exemplifying frequency responses of the first filter 110-1 and the second filter 110-2 included in the filtering unit 110.

The first filter 110-1 only passes a portion of the digital audio signal having a frequency lower than the crossover frequency, and the second filter 110-2 only passes a portion of the digital audio signal having a frequency higher than the crossover frequency. Hereinafter, the portion of the digital audio signal having the frequency lower than the crossover frequency i.e., the first band audio signal will be referred to as a low band audio signal, and the portion of the digital audio signal having the frequency higher than the crossover frequency, i.e., the second band audio signal will be referred to as a high band audio signal.

The digital audio signal passed through the first filter 110-1 and the second filter 110-2 are divided into the low band audio signal and the high band audio signal, respectively, to be inputted to the first DRC 120-1 and the second DRC 120-2.

The first DRC 120-1 and the second DRC 120-2 dynamically compress output signals, i.e., the low band audio signal and the high band audio signal, outputted from the first filter 110-1 and the second filter 110-2, respectively, and output the compressed output signals of the first filter 110-1 and the second filter 110-2. That is, the first DRC 120-1 and the second DRC 120-2 have independent thresholds, respectively, and dynamically compress and output the low band audio signal and the high band audio signal according to the independent thresholds.

Figure 6:
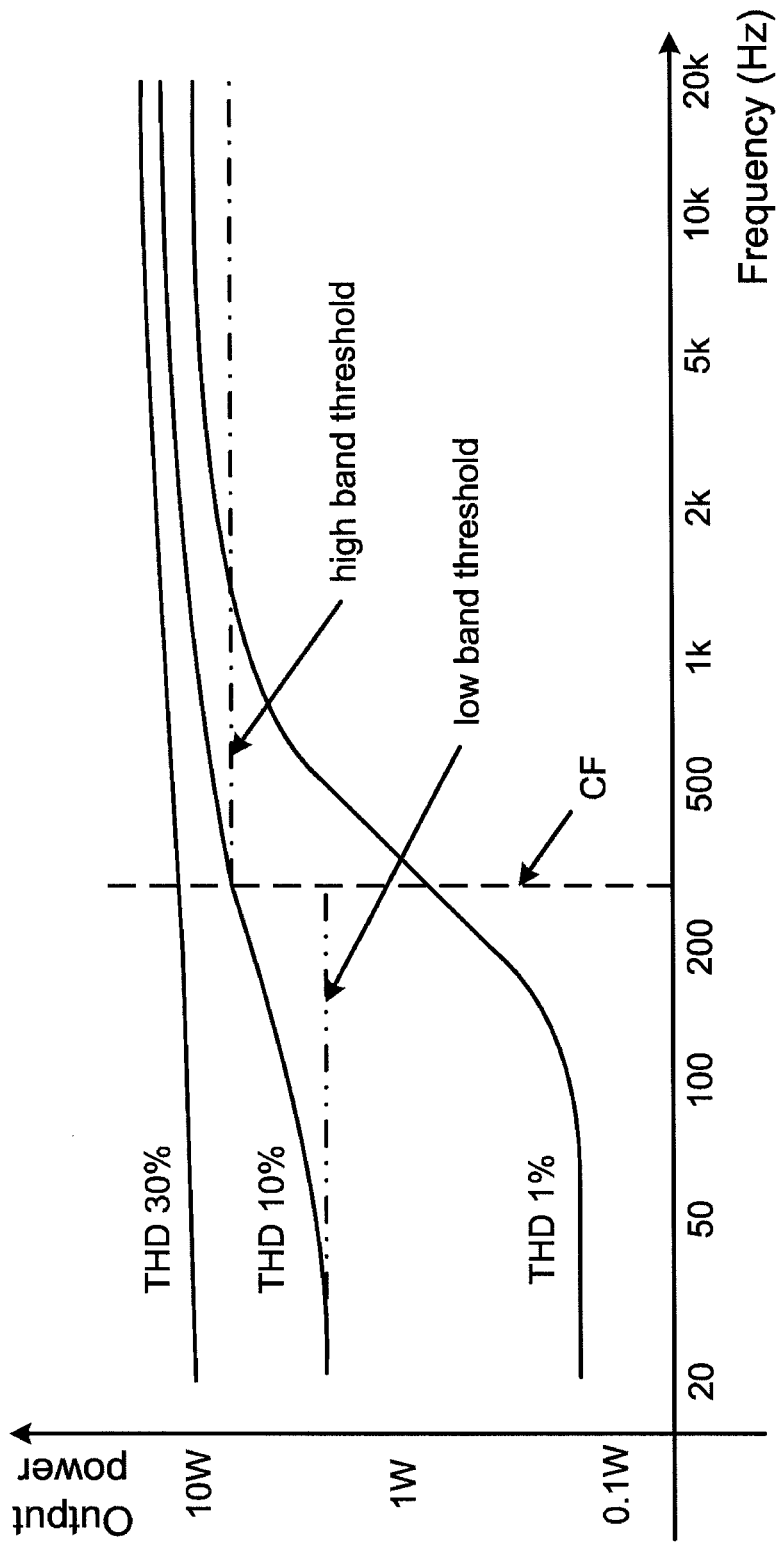
FIG. 6 is a graph exemplifying a relationship between a frequency and an output signal power.

FIG. 6 is a graph exemplifying a relationship between a frequency and a power of an output signal when THDs are 1%, 10% and 30%.

As shown in FIG. 6, a relatively low THD can be maintained for high power, high frequency audio signal. However it is difficult to maintain the low THD for high power, low frequency audio signal.

When designing an audio circuit, the target THD is selected by considering a cost, a feasibility, an output power and applications. In addition, the crossover frequency is selected by considering a cost of designing filter and a feasibility.

When the target THD and the crossover frequency are selected, the threshold of each band is selected by referring to the graph such as FIG. 6. When the thresholds of the high band and the low band, i.e., the threshold of first DRC 120-1 and the second DRC 120-2 are selected by referring to FIG. 6, the proper threshold may be selected for the audio signal of the each band while maintaining the THD below the target THD.

The first DRC 120-1 and the second DRC 120-2 dynamically compress into the low band audio signal and the high band audio signal, respectively, according to the threshold selected in FIG. 6.

The adder 130 adds the output signals of the first DRC 120-1 and the second DRC 120-2, i.e., compressed the low band audio signal and the high band audio signal and outputs added output signals.

Figure 7:
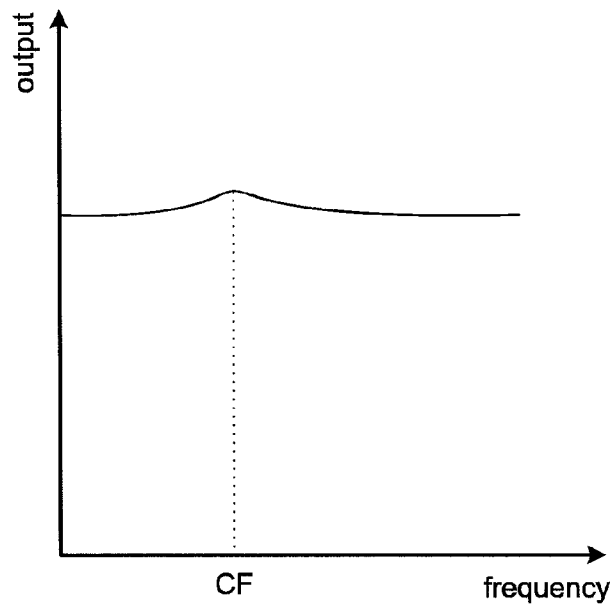
FIG. 7 is a graph exemplifying an output signal with respect to a frequency of a multiband DRC system in accordance with a first embodiment shown in FIG. 4.

As shown in FIG. 7, the output signal of the adder 130 is widely distributed along the entire bands.

Figure 8:
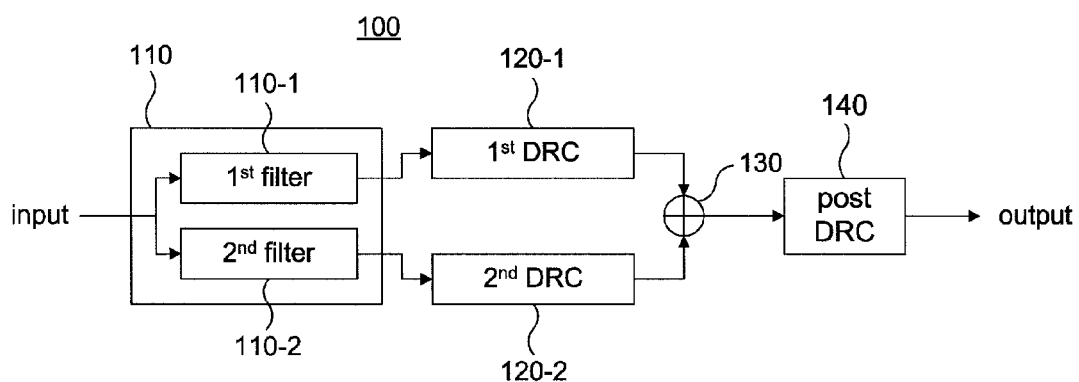
FIG. 8 is a block diagram exemplifying a multiband DRC system in accordance with a second embodiment of the present invention.

FIG. 8 is a block diagram exemplifying a multiband DRC system in accordance with a second embodiment of the present invention.

The multiband DRC system in accordance with the second embodiment of the present invention shown in FIG. 8 is identical to that of FIG. 4 except a post DRC 140. Therefore, only the post DRC 140 will be described in detail and detailed description of other components will be omitted.

The post DRC 140 dynamically compresses the output signal of the adder 130.

Referring to FIG. 7, the output signal of the adder 130 widely distributed along the entire bands. However, an amplitude of the output signal is slightly increased near the crossover frequency.

As the first filter 110-1 and the second filter 110-2 overlap each other, the output signals are also overlapped with each other resulting in a partial distortion.

Figure 9:
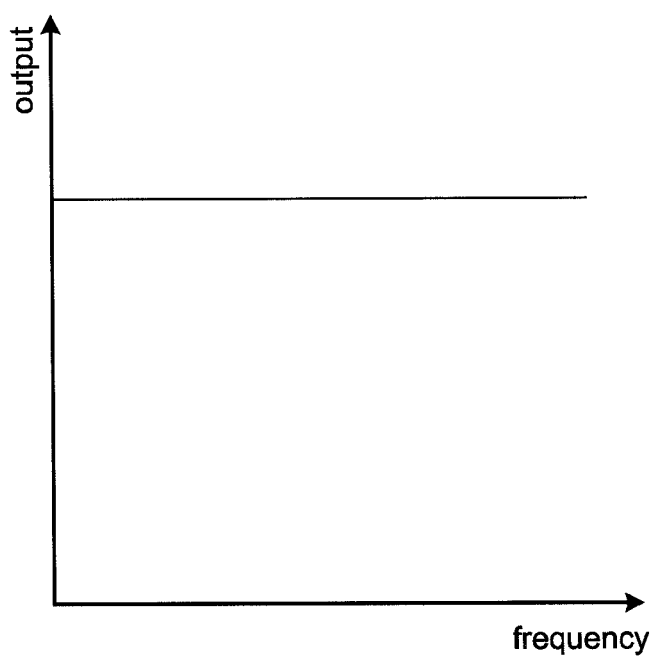
FIG. 9 is a graph exemplifying an output signal with respect to a frequency of a multiband DRC system in accordance with a second embodiment shown in FIG. 8.

When the output signal of the adder 130 is compressed through the post DRC 140, the amplitude thereof may be limited near the crossover frequency. That is, when the threshold of the post DRC 140 is properly selected, an increment in the amplitude of the output signal can be limited near the crossover frequency to obtain the output signal shown in FIG. 9.

Figure 10:
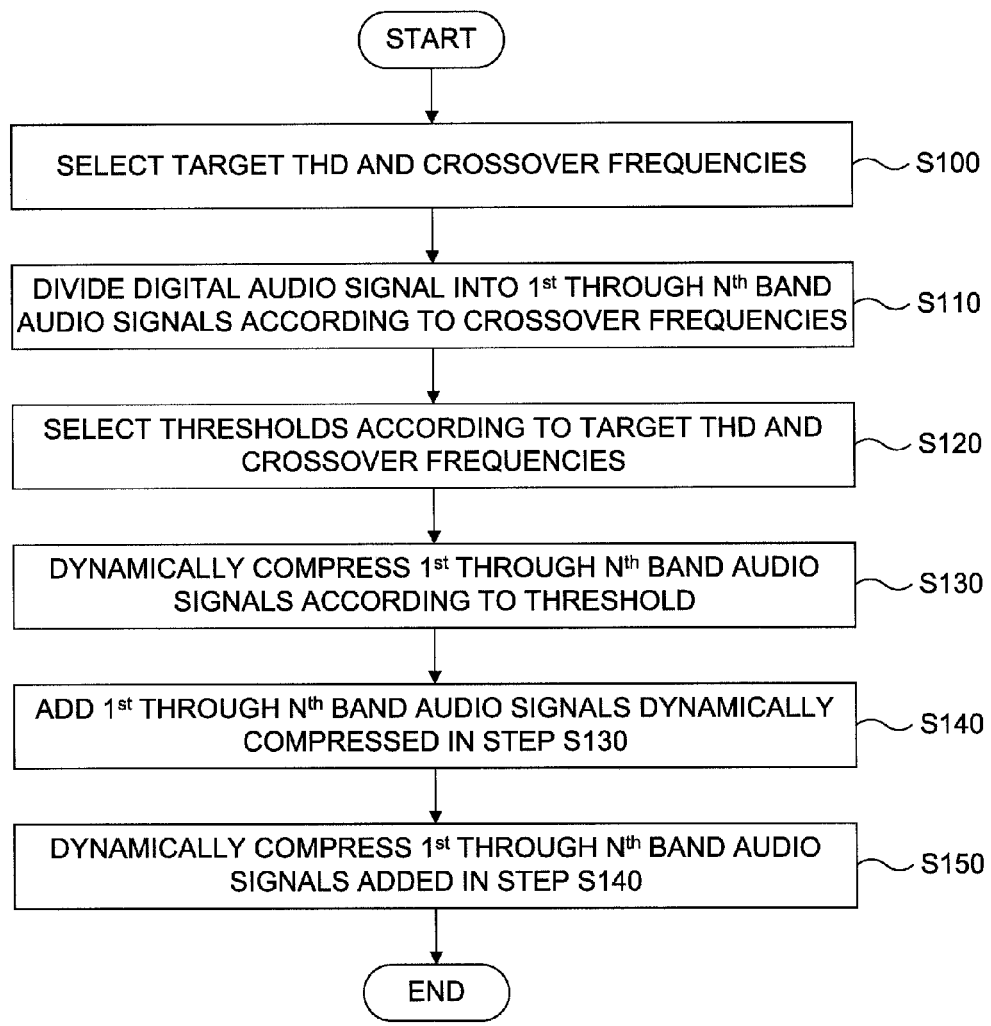
FIG. 10 is a flow diagram illustrating a method for controlling thresholds of a multiband DRC system in accordance with a second embodiment of the present invention.

FIG. 10 is a flow diagram illustrating a method for selecting a threshold of a multiband DRC system in accordance with the second embodiment of the present invention.

Referring to FIG. 10, a digital audio signal is divided into a first band audio signal through an $N^{th}$ band audio signal according to (N−1) crossover frequencies (S100, S110).

Specifically, a target THD and the (N−1) crossover frequencies are selected (S100). Thereafter, the digital audio signal is divided into the first band audio signal through the $N^{th}$ band audio signal according to the (N−1) crossover frequencies selected in the step S100 (S110).

Thereafter, the first band audio signal through the $N^{th}$ band audio signal are dynamically compressed (S120, S130).

Specifically, thresholds are selected according to the target THD and the (N−1) crossover frequencies (S120). Thereafter, the first band audio signal through the $N^{th}$ band audio signal are dynamically compressed, respectively, according to the threshold selected in the step S120 (S130).

Thereafter, the first band audio signal through the $N^{th}$ band audio signal dynamically compressed in the step S130 are added (S140).

Thereafter, the first band audio signal through the $N^{th}$ band audio signal added in the step S140 is dynamically compressed through a post DRC (S150).

A multiband DRC system in accordance with a third embodiment of the present invention is described hereinafter in more detail.

Figure 11:
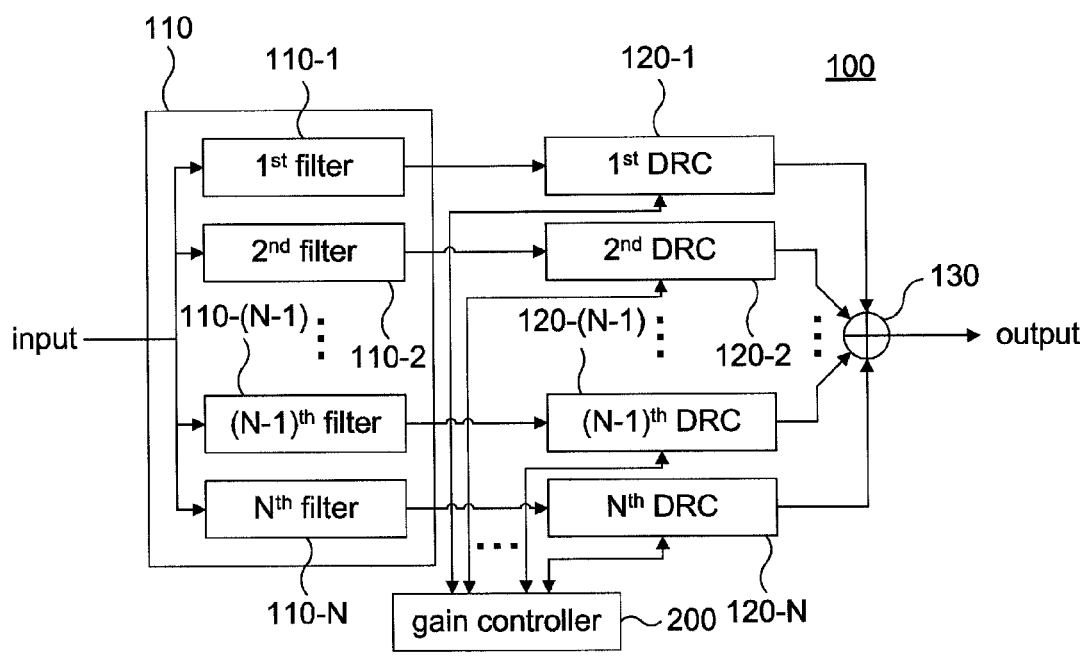
FIG. 11 is a block diagram exemplifying a multiband DRC system in accordance with a third embodiment of the present invention.

FIG. 11 is a block diagram exemplifying a multiband DRC system in accordance with a third embodiment of the present invention.

Referring to FIG. 11, the multiband DRC system 100 in accordance with the third embodiment of the present invention includes a filtering unit 110, a first DRC 120-1 though an $N^{th}$ DRC 120-N, an adder 130 and a gain controller 200.

In addition, the filtering unit 110 includes a first filter 110-1 through an $N^{th}$ filter 110-N.

The filtering unit 110 divides a digital audio signal into a first band audio signal through an $N^{th}$ band audio signal according to (N−1) crossover frequencies.

The first DRC 120-1 through the $N^{th}$ DRC 120-N dynamically compress output signals of the filtering unit 110, i.e., the first band audio signal through the $N^{th}$ band audio signal, respectively.

The gain controller 200 controls gains of the first DRC 120-1 through the $N^{th}$ DRC according to an upper limit of differences between the gains.

Specifically, when the difference between the gains of the $L^{th}$ DRC and the $M^{th}$ DRC exceeds the upper limit, the gain controller 200 limits one of the gains of the $L^{th}$ DRC and the $M^{th}$ DRC, whichever is greater, such that the difference of the gains of the $L^{th}$ DRC and the $M^{th}$ DRC, is no more than the upper limit, where each of L and M is a natural number satisfying 1=<L, M<=N.

The first DRC 120-1 through the $N^{th}$ DRC dynamically compress the first band audio signal through the $N^{th}$ band audio signal, respectively, according to the respective gains controlled by the gain controller 200.

The adder 130 adds output signals of the first DRC 120-1 through the $N^{th}$ DRC 120-N.

A configuration of the multiband DRC system 100 in accordance with the third embodiment of the present invention are described hereinafter in greater detail.

Figure 12:
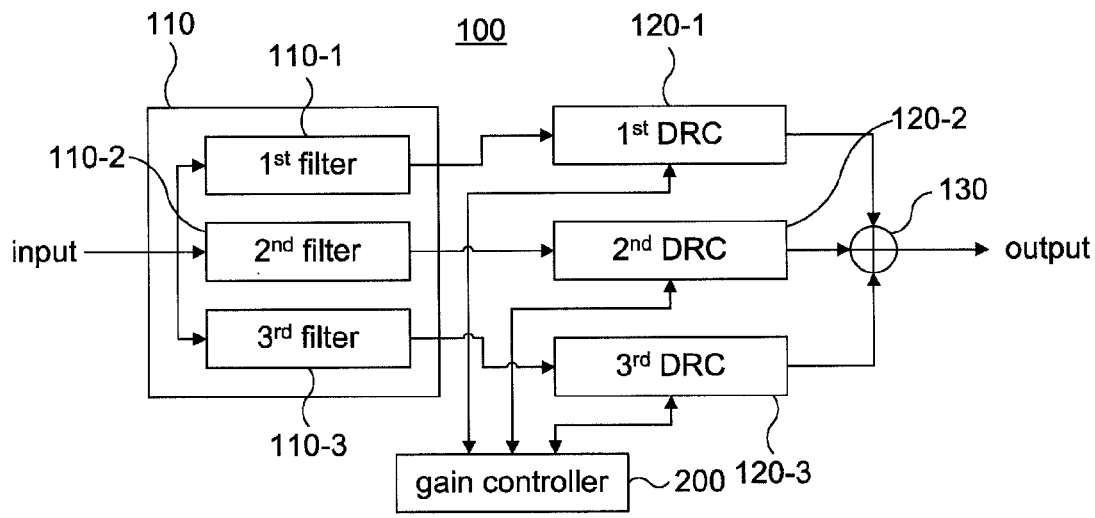
FIG. 12 is a block diagram exemplifying a multiband DRC system in accordance with a third embodiment of the present invention.

FIG. 12 is a block diagram exemplifying the multiband DRC system 100 in accordance with the third embodiment of the present invention, wherein the system includes the three DRCs, i.e., n is 3.

Referring to FIG. 12, the multiband DRC system 100 in accordance with the third embodiment of the present invention includes the filtering unit 110, the first DRC 120-1, the second DRC 120-2, the third DRC 120-3, the adder 130 and the gain controller 200.

The filtering unit 110 includes the first filter 110-1 through the third filter 110-3 dividing the digital audio signal into first band audio signal through the third band audio signal, respectively, according to the crossover frequencies.

Figure 13:
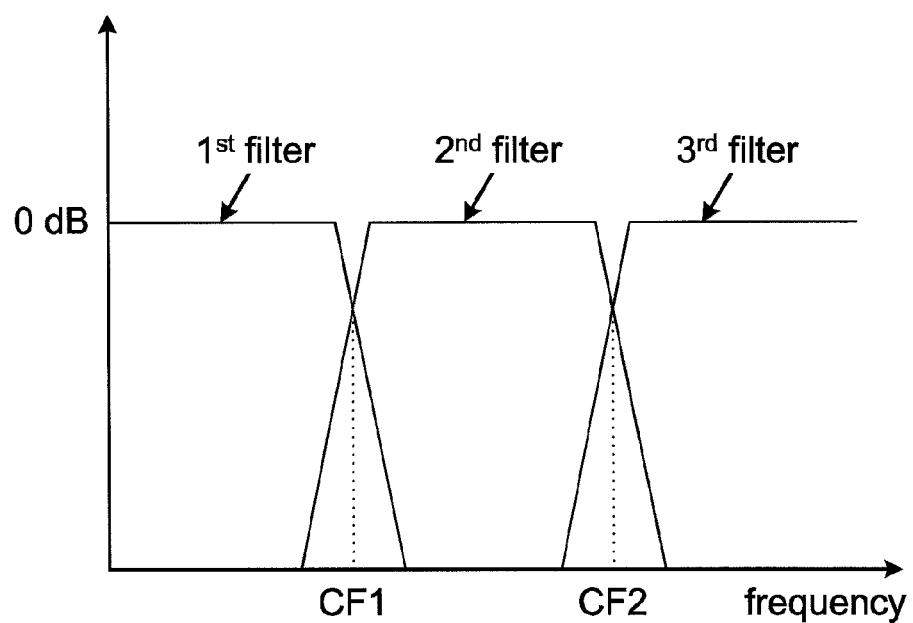
FIG. 13 is a graph exemplifying frequency responses of a first filter through a third filter included in a filtering unit shown in FIG. 12.

FIG. 13 is a graph exemplifying frequency responses of the first filter 110-1 through the third filter 110-3 included in the filtering unit 110.

As shown in FIG. 3, the first filter 110-1 only passes a portion of the digital audio signal having a frequency lower than the crossover frequency CF1, the second filter 110-2 only passes a portion of the digital audio signal having a frequency between the crossover frequency CF1 and the crossover frequency CF2, and the third filter 110-3 only passes a portion of the digital audio signal having a frequency higher than the crossover frequency CF2. Hereinafter, the portion of the digital audio signal having the frequency lower than the crossover frequency CF1, i.e., the first band audio signal will be referred to as a low band audio signal, the portion of the digital audio signal having the frequency between the crossover frequency CF1 and the crossover frequency CF2, i.e., the second band audio signal will be referred to as a intermediate band audio signal, and the portion of the digital audio signal having the frequency higher than the crossover frequency CF2, i.e., the third band audio signal will be referred to as a high band audio signal.

The digital audio signal passed through the first filter 110-1 through the third filter 110-3 are divided into the low band signal, the intermediate band signal and the high band signal, respectively, to be inputted to the first DRC 120-1 through the third DRC 120-3.

The first DRC 120-1 through the third DRC 120-3 dynamically compress output signals of the first filter 110-1 through the third filter 110-3, i.e., the low band audio signal, the intermediate band audio signal and the high band audio signal, respectively, and output the compressed output signals of the first filter 110-1 through the third filter 110-3. That is, the first DRC 120-1 through the third DRC 120-3 have independent gains, respectively, and dynamically compress and output the low band audio signal, the intermediate band signal and the high band audio signal according to the independent gains.

The gain controller 200 controls the gains of the first DRC 120-1 through the third DRC 120-3 according to the upper limit of the differences between the gains.

Figure 14:
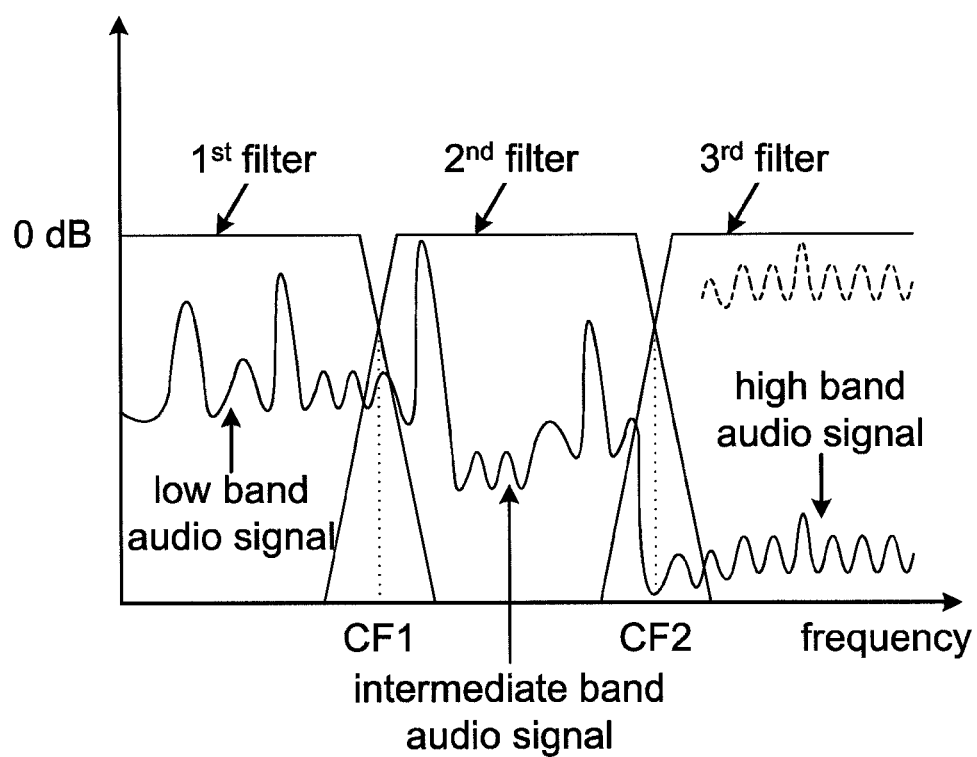
FIG. 14 is a graph exemplifying frequency responses of a first filter through a third filter included in a filtering unit and audio signal shown in FIG. 12. a first filter through a third filter and digital audio signals shown in FIG. 12.

An operation of the gain controller 200 is described in more detail referring to FIG. 14.

FIG. 14 is a graph exemplifying the first filter 110-1 through the third filter 110-3 and the digital audio signal.

Referring to FIG. 14, the digital audio signals is divided into the low band audio signal, the intermediate band audio signal and the high band audio signal, respectively, by the first filter 110-1 through the third filter 110-3.

The first DRC 120-1 through the third DRC 120-3 dynamically compress the low band audio signal, the intermediate band audio signal and the high band audio signal according to the gains.

The high band audio signal among the audio signal shown in FIG. 14 is amplified by the third DRC 120-3 with a high gain because the amplitude of the high band audio signal is small. Particularly, the high band audio signal shown in FIG. 14 which is very small, and wide band signal has high probability of being a noise.

General high band audio signal, which is not the noise, does not affect an audio quality when amplified with the high gain. However, the high band audio signal which is the noise as shown in FIG. 14 causes a degradation in the audio quality.

Therefore, it is necessary to properly control the gain for amplifying the high band audio signal.

The gain controller 200 obtains the differences between the gains of the first DRC 120-1 through the third DRC 120-3, and determines whether each of the differences between the gains exceed the upper limit and controls the gains of the first DRC 120-1 through the third DRC 120-3.

Specifically, the gain controller 200 obtains the difference between the gain of the first DRC 120-1 and the second DRC 120-2, the difference between the gain of the second DRC 120-2 and the third DRC 120-3 and the difference between the gain of the first DRC 120-1 and the third DRC 120-3. When one of the difference exceeds the upper limit, the gain controller 200 controls the corresponding gains.

For instance, when the difference between the gain of the second DRC 120-2 and the third DRC 120-3 exceeds the upper limit, the gain controller 200 limits one of the gains of the second DRC 120-2 and the third DRC 120-3, whichever is greater, so that the difference between of the gains of the second DRC 120-2 and the third DRC 120-3 does not exceed the upper limit.

Figure 15:
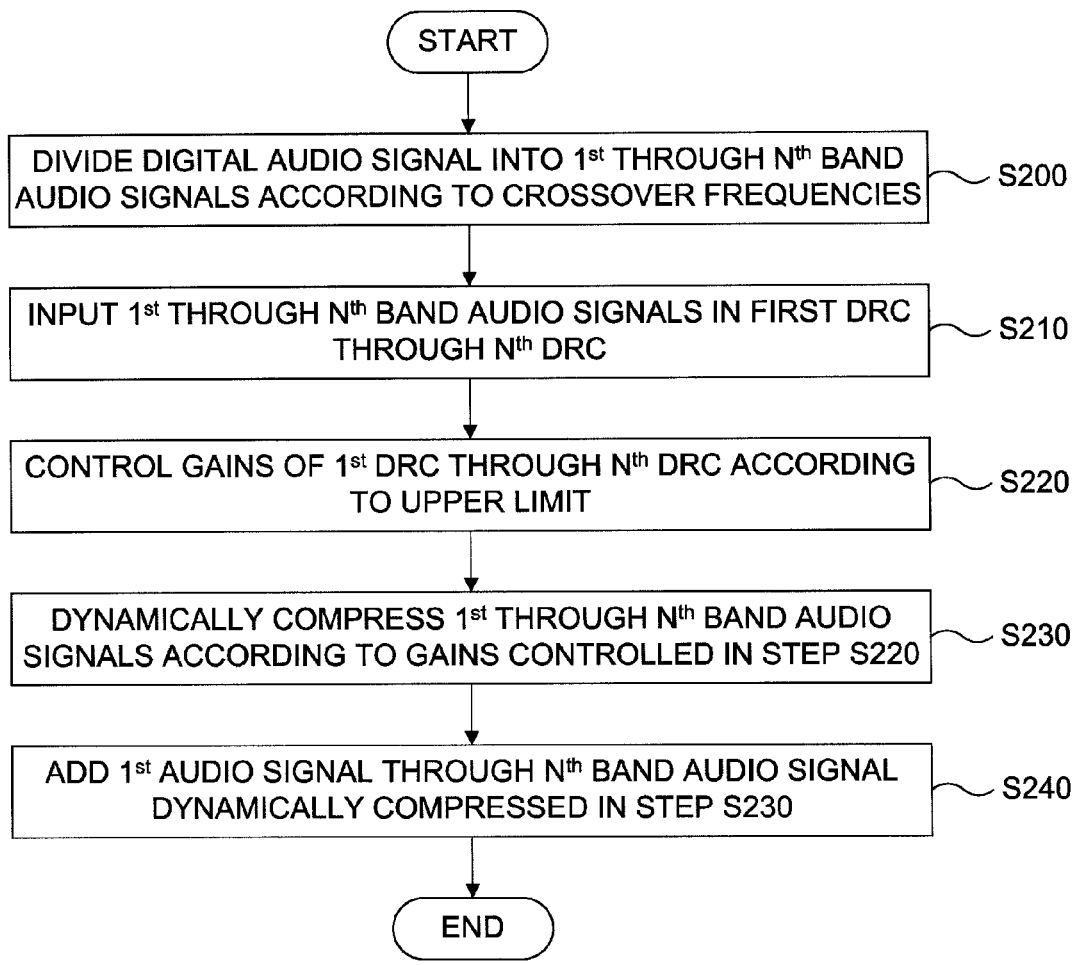
FIG. 15 is a flow diagram illustrating a method for controlling gains of a multiband DRC system in accordance with a third embodiment of the present invention.

FIG. 15 is a flow diagram illustrating a method for controlling gains of a multiband DRC system in accordance with the third embodiment of the present invention.

Referring to FIG. 15, a digital audio signal is divided into a first band audio signal through an $N^{th}$ band audio signal according to (N−1) crossover frequencies (S200).

Thereafter, the first band audio signal through the $N^{th}$ band audio signal are inputted into a first DRC 120-1 through an $N^{th}$ DRC 120-N, respectively (S210).

Thereafter, gains of the first DRC 120-1 through the $N^{th}$ DRC 120-N are controlled according to an upper limit of differences between the gains (S220).

Specifically, when the difference between the gains of the $L^{th}$ DRC and the $M^{th}$ DRC exceeds the upper limit, the gain controller 200 limits one of the gains of the $L^{th}$ DRC and the $M^{th}$ DRC, whichever is greater, such that the difference of the gains of the $L^{th}$ DRC and the $M^{th}$ DRC, is no more than the upper limit, where each of L and M is a natural number satisfying 1=<L, M<=N.

Thereafter, the first band audio signal through the $N^{th}$ band audio signal are dynamically compressed according to the gains controlled in the step S220 (S230).

Thereafter, the first band audio signal through the $N^{th}$ band audio signal dynamically compressed in the step S230 are added (S240).

Above-described, the multiband DRC system and the method for controlling the same in accordance with the present invention have following advantages.

First, the system and the method are capable of increasing the overall loudness of the output signal by controlling the thresholds and the gains of the plurality of DRCs included in the multiband DRC system according to the frequency bands. Particularly, the drawback can be overcome wherein an input signal in one frequency band is reproduced with a relatively small loudness when an input signal larger than the threshold is concentrated in another frequency band.

Second, over-amplification of the noise can be prevented by adjusting the difference between the gains to be below the upper limit when the noise is concentrated in a certain frequency band.

Third, when the present invention is applied to an audio device employing speakers with a small diameter having a poor low frequency reproduction capability, a high frequency sound can be sufficiently reproduced while the distortion of low frequency sound by the speaker is prevention.

While the present invention has been particularly shown and described with reference to the preferred embodiment thereof, it will be understood by those skilled in the art that various changes in form and details may be effected therein without departing from the spirit and scope of the invention as defined by the appended claims.

What is claimed is:

1. A multiband Dynamic Range Compressor (DRC) system, comprising:
    a filtering unit for dividing a digital audio signal into a first band audio signal through an $N^{th}$ band audio signal according to (N−1) crossover frequencies;
    a first DRC through an $N^{th}$ DRC having a first threshold through an $N^{th}$ threshold, respectively, the first DRC through the $N^{th}$ DRC dynamically compressing the first band audio signal through the $N^{th}$ band audio signal, respectively; and
    an adder for adding output signals of the first DRC through the $N^{th}$ DRC,
    wherein the first threshold through the $N^{th}$ threshold are selected according to a target Total Harmonic Distortion (THD) and the (N−1) crossover frequencies, wherein the first threshold through the $N^{th}$ threshold are values of output power.

2. The system in accordance with claim 1, further comprising a post DRC for dynamically compressing an output signal of the adder.

3. The system in accordance with claim 2, wherein the filtering unit includes a first filter through an $N^{th}$ filter for dividing the digital audio signal into the first band audio signal through the $N^{th}$ band audio signal, respectively, according to the (N−1) crossover frequencies.

4. The system in accordance with claim 1, further comprising a gain controller for controlling gains of the first DRC through the $N^{th}$ DRC according to an upper limit of differences between the gains.

5. The system in accordance with claim 4, wherein the gain controller limits one of gains of an $L^{th}$ DRC and an $M^{th}$ DRC such that a difference between the pains of the $L^{th}$ DRC and the $M^{th}$ DRC is no more than the upper limit when the difference between the gains of the $L^{th}$ DRC and the $M^{th}$ DRC exceeds the upper limit, wherein each of L and M is a natural number satisfying 1≤L, M≤N.

6. A method for controlling a multiband Dynamic Range Compressor (DRC) system, comprising:
   (a) dividing a digital audio signal into a first band audio signal through an $N^{th}$ band audio signal according to (N−1) crossover frequencies;
   (b) selecting a first threshold through an $N^{th}$ threshold of a first DRC through an $N^{th}$ DRC, respectively, according to a target Total Harmonic Distortion (THD) and the (N−1) crossover frequencies, wherein the first threshold through the $N^{th}$ threshold are values of output power;
   (c) dynamically compressing the first band audio signal through the $N^{th}$ band audio input to the first DRC through the $N^{th}$ DRC according to the first threshold through the $N^{th}$ threshold, respectively; and
   (d) adding the first band audio signal through the $N^{th}$ band audio signal dynamically compressed in step (c).

7. The method in accordance with claim 6, further comprising (e) dynamically compressing the first band audio signal through the $N^{th}$ band audio signal added in step (d).

8. The method in accordance with claim 6, wherein step (c) comprises:
   (c-1) inputting the first band audio signal through the $N^{th}$ band audio signal to the first DRC through the $N^{th}$ DRC, respectively;
   (c-2) selecting gains of the first DRC through the $N^{th}$ DRC according to an upper limit of differences between the gains; and
   (c-3) dynamically compressing the first band audio signal through the $N^{th}$ band audio signal according to the gains selected step (c-2).

9. The method in accordance with claim 8, wherein the step step (c-2) comprises limiting one of gains of an $L^{th}$ DRC and an $M^{th}$ DRC such that a difference between the gains of the $L^{th}$ DRC and the $M^{th}$ DRC is no more than the upper limit when the difference between the gains of the $L^{th}$ DRC and the $M^{th}$ DRC exceeds the upper limit, wherein each of L and M is a natural number satisfying 1≤L, M≤N.

* * * * *